US011527738B2

(12) United States Patent
Zhang et al.

(10) Patent No.: US 11,527,738 B2
(45) Date of Patent: Dec. 13, 2022

(54) DISPLAY SUBSTRATE COMPRISING METAL LAYER STRUCTURE IN NON-DISPLAY REGION AND WITH RECESSED SIDE SURFACE, PREPARATION METHOD THEREOF, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Zhen Zhang, Beijing (CN); Yuqing Yang, Beijing (CN); Yue Wei, Beijing (CN); Yiyang Zhang, Beijing (CN); Lei Deng, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 268 days.

(21) Appl. No.: 16/767,663

(22) PCT Filed: Jul. 12, 2019

(86) PCT No.: PCT/CN2019/095805
§ 371 (c)(1),
(2) Date: May 28, 2020

(87) PCT Pub. No.: WO2021/007712
PCT Pub. Date: Jan. 21, 2021

(65) Prior Publication Data
US 2022/0077423 A1 Mar. 10, 2022

(51) Int. Cl.
*H01L 21/00* (2006.01)
*H01L 51/52* (2006.01)
(Continued)

(52) U.S. Cl.
CPC .......... *H01L 51/5253* (2013.01); *H01L 51/56* (2013.01); *H01L 27/3258* (2013.01);
(Continued)

(58) Field of Classification Search
CPC .................................................. H01L 51/5253
See application file for complete search history.

(56) References Cited

U.S. PATENT DOCUMENTS 10,629,662 B2    4/2020   Ding
2017/0110532 A1*  4/2017   Kim .................... H01L 51/0096
(Continued)

FOREIGN PATENT DOCUMENTS

CN    108666347 A    10/2018
CN    109742121 A     5/2019
(Continued)

*Primary Examiner* — Caleb E Henry
(74) *Attorney, Agent, or Firm* — Dilworth & BaRrese, LLP.; Michael J. Musella, Esq.

(57) ABSTRACT

A display substrate and a preparation method thereof, and a display device are provided. The preparation method includes: forming a display region and a non-display region including an opening region; forming a first barrier wall between the display region and the opening region, in which the first barrier wall surrounds the opening region and includes a first metal layer structure, and a recess is formed on at least one side surface, surrounding the opening region, of the first metal layer structure; and after the first barrier wall is formed, forming a conductive layer pattern in the display region and on the first barrier wall. The forming the conductive layer pattern includes: forming a conductive material layer in the display region and on the first barrier
(Continued)

wall, the conductive material layer being disconnected at the first barrier wall; and patterning the conductive material layer to form the conductive layer pattern.

20 Claims, 10 Drawing Sheets

(51) Int. Cl.
  *H01L 51/56* (2006.01)
  *H01L 27/32* (2006.01)
  *H01L 51/00* (2006.01)
(52) U.S. Cl.
  CPC ...... *H01L 51/0096* (2013.01); *H01L 51/5206* (2013.01); *H01L 2227/323* (2013.01)

(56) References Cited

U.S. PATENT DOCUMENTS

| | | | |
|---|---|---|---|
| 2017/0162637 A1* | 6/2017 | Choi | H01L 51/5237 |
| 2019/0074465 A1* | 3/2019 | Jung | H01L 51/56 |
| 2019/0333974 A1* | 10/2019 | Jiang | H01L 27/3246 |
| 2020/0227486 A1* | 7/2020 | Liu | H01L 27/3246 |

FOREIGN PATENT DOCUMENTS

| | | |
|---|---|---|
| CN | 109904208 A | 6/2019 |
| CN | 109935621 A | 6/2019 |
| CN | 110164916 A | 8/2019 |

\* cited by examiner

DISPLAY SUBSTRATE COMPRISING METAL LAYER STRUCTURE IN NON-DISPLAY REGION AND WITH RECESSED SIDE SURFACE, PREPARATION METHOD THEREOF, AND DISPLAY DEVICE

TECHNICAL FIELD

Embodiments of the present disclosure relate to a display substrate and a preparation method thereof, and a display device.

BACKGROUND

At present, a display screen of a display device is developing towards large screen and full screen. Generally, a display device (e.g., a mobile phone, a tablet computer, etc.) has a camera component (or an imaging component), which is usually disposed on a side of a region outside the display region of the display screen. However, installation of the camera component requires a certain space, which is not beneficial to a design of full screen and narrow frame of the display screen. For example, the camera component may be combined into the display region of the display screen, and a space is reserved for the camera component in the display region, so as to maximize the display region of the display screen.

SUMMARY

At least one embodiment of the present disclosure provides a preparation method of a display substrate, the preparation method comprises: forming a display region and a non-display region, in which the display region at least partially surrounds the non-display region, and the non-display comprises an opening region; forming a first barrier wall between the display region and the opening region, in which the first barrier wall surrounds the opening region and comprises a first metal layer structure, and a recess is formed on at least one side surface, surrounding the opening region, of the first metal layer structure; and after the first barrier wall is formed, forming a conductive layer pattern in the display region and on the first barrier wall, in which the forming the conductive layer pattern comprises: forming a conductive material layer in the display region and on the first barrier wall, in which the conductive material layer is disconnected at the first barrier wall, and patterning the conductive material layer to form the conductive layer pattern.

For example, the preparation method provided by at least one embodiment of the present disclosure further comprises forming an opening in the opening region of the display substrate; and bonding an image sensor and/or an infrared sensor in the opening region.

For example, in the preparation method provided by at least one embodiment of the present disclosure, the patterning the conductive material layer comprises: forming a photoresist pattern on the conductive material layer, in which the photoresist pattern covers the at least one side surface of the first barrier wall, and etching the conductive material layer with the photoresist pattern as a mask to form the conductive layer pattern.

For example, the preparation method provided by at least one embodiment of the present disclosure further comprises forming a light emitting element in the display region, in which the light emitting element comprises a first electrode, a second electrode, and an organic function layer between the first electrode and the second electrode, and the conductive layer pattern comprises the first electrode.

For example, in the preparation method provided by at least one embodiment of the present disclosure, the organic function layer is disconnected at the first barrier wall, the first electrode is an anode, the second electrode is a cathode, and the cathode is disconnected at the first barrier wall.

For example, the preparation method provided by at least one embodiment of the present disclosure further comprises: forming a second metal pattern in the display region, in which the second metal pattern comprises a second metal layer structure, and the first metal layer structure and the second metal layer structure are formed by same layers.

For example, in the preparation method provided by at least one embodiment of the present disclosure, forming the first metal layer structure comprises: forming a first metal material pattern on a base substrate, and etching the first metal material pattern with a first etching solution to form the recess.

For example, in the preparation method provided by at least one embodiment of the present disclosure, forming the first metal material pattern comprises: forming a first sub-metal pattern and a second sub-metal pattern that are sequentially stacked on the base substrate, in which an etching rate of the first etching liquid to the first sub-metal pattern is larger than an etching rate of the first etching liquid to the second sub-metal pattern.

For example, in the preparation method provided by at least one embodiment of the present disclosure, the forming the first metal material pattern comprises: forming a third sub-metal pattern, a first sub-metal pattern and a second sub-metal pattern that are sequentially stacked on the base substrate, in which an etching rate of the first etching liquid to the first sub-metal pattern is larger than both an etching rate of the first etching liquid to the second sub-metal pattern and an etching rate of the first etching liquid to the third sub-metal pattern.

For example, in the preparation method provided by at least one embodiment of the present disclosure, the forming the first metal layer structure comprises: forming a first metal material pattern, forming an insulation material layer in the display region and on the first metal material pattern, and patterning the insulation material layer with a second etching solution to form a patterned insulation layer.

For example, in the preparation method provided by at least one embodiment of the present disclosure, the second etching liquid etches the first metal material pattern to form the recess.

For example, in the preparation method provided by at least one embodiment of the present disclosure, the insulation material layer comprises a photoresist material, and the second etching liquid is a development solution for the photoresist material.

For example, in the preparation method provided by at least one embodiment of the present disclosure, the developing solution comprises tetramethyl ammonium hydroxide, tetraethyl ammonium hydroxide, tetrapropyl ammonium hydroxide, alkyl alcohol amine, sodium hydroxide, potassium hydroxide, sodium carbonate, sodium phosphate, sodium dihydrogen phosphate or sodium acetate.

For example, in the preparation method provided by at least one embodiment of the present disclosure, the development solution comprises tetramethyl ammonium hydroxide, the tetramethyl ammonium hydroxide in the development solution is ranged from 2% to 8%, and time for the development solution to etch the first metal material pattern to form the recess is ranged from 60 seconds to 200 seconds.

For example, in the preparation method provided by at least one embodiment of the present disclosure, the forming the first metal material pattern comprises: forming a first sub-metal pattern and a second sub-metal pattern that are sequentially stacked on the base substrate, in which an etching rate of the second etching liquid to the first sub-metal pattern is larger than an etching rate of the second etching liquid to the second sub-metal pattern.

For example, in the preparation method provided by at least one embodiment of the present disclosure, the forming the first metal material pattern comprises: forming a third sub-metal pattern, a first sub-metal pattern and a second sub-metal pattern that are sequentially stacked on the base substrate, in which an etching rate of the second etching liquid to the first sub-metal pattern is larger than both an etching rate of the second etching liquid to the second sub-metal pattern and an etching rate of the second etching liquid to the third sub-metal pattern.

For example, in the preparation method provided by at least one embodiment of the present disclosure, a material of the first sub-metal pattern comprises aluminum or copper, and a material of the second sub-metal pattern comprises titanium or molybdenum.

For example, in the preparation method provided by at least one embodiment of the present disclosure, a material of the first sub-metal pattern comprises aluminum or copper, a material of the second sub-metal pattern comprises titanium or molybdenum, and a material of the third sub-metal pattern comprises titanium or molybdenum.

For example, the preparation method provided by at least one embodiment of the present disclosure, further comprising: forming a second barrier wall between the display region and the non-display region, in which the second barrier wall surrounds the non-display region and is formed on one side, away from the non-display region, of the first barrier wall, and the second barrier wall and the first barrier wall are formed by same layers.

At least one embodiment of the present disclosure further provides a display substrate, and the display substrate comprises: a display region, a non-display region, and a first barrier wall between the display region and the opening region; the display region at least partially surrounds the non-display region, and the non-display comprises an opening region; the first barrier wall surrounds the opening region and comprises a first metal layer structure, and a recess is provided on at least one side surface, surrounding the opening region, of the first metal layer structure; the display region comprises a conductive layer pattern, the conductive layer pattern is further provided on the first barrier wall and is disconnected on the at least one side surface of the first barrier wall.

For example, the display substrate provided by at least one embodiment of the present disclosure further comprises an opening in the opening region and an image sensor and/or an infrared sensor bonded in the opening region.

For example, the display substrate provided by at least one embodiment of the present disclosure further comprises a light emitting element in the display region, the light emitting element comprises a first electrode, a second electrode, and an organic function layer between the first electrode and the second electrode, and the conductive layer pattern comprises the first electrode.

For example, in the display substrate provided by at least one embodiment of the present disclosure, the organic function layer is disconnected at the first barrier wall; the first electrode is an anode, the second electrode is a cathode, and the cathode is disconnected at the first barrier wall.

At least one embodiment of the present disclosure further provides a display device, and the display device comprises the display substrate formed the preparation method mentioned above, or comprises the display substrate mentioned above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish different components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect" or "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In order to maximize a display region of a display device, a camera component (i.e. an imaging component) of the display device for example is combined into the display region, and the camera component is disposed in the display region.

Figure 1A:
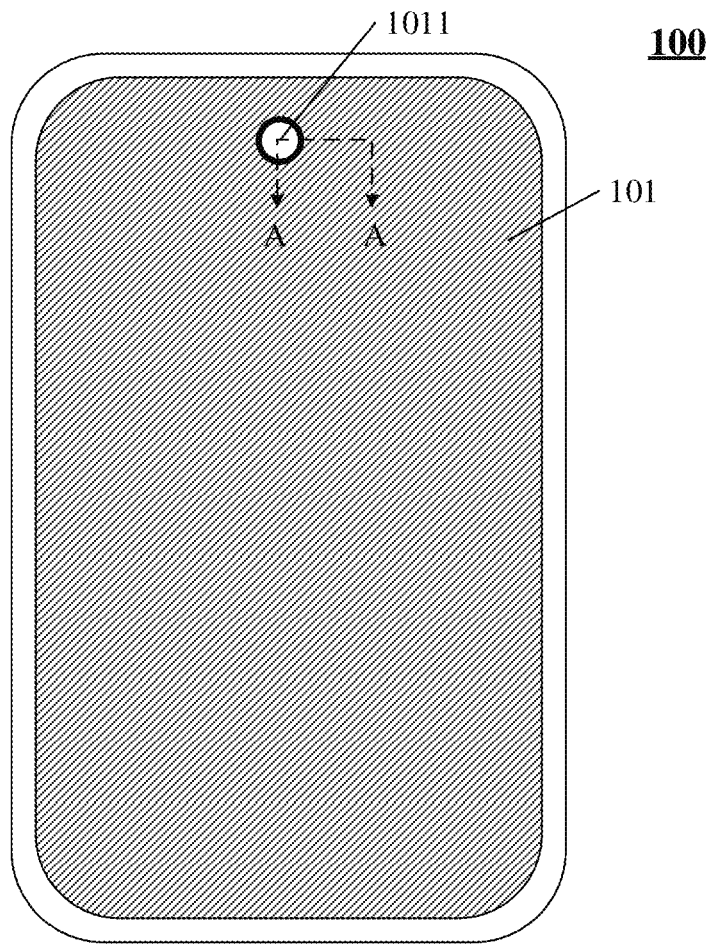
FIG. 1A is a planar schematic diagram of a display substrate.
Figure 1B:
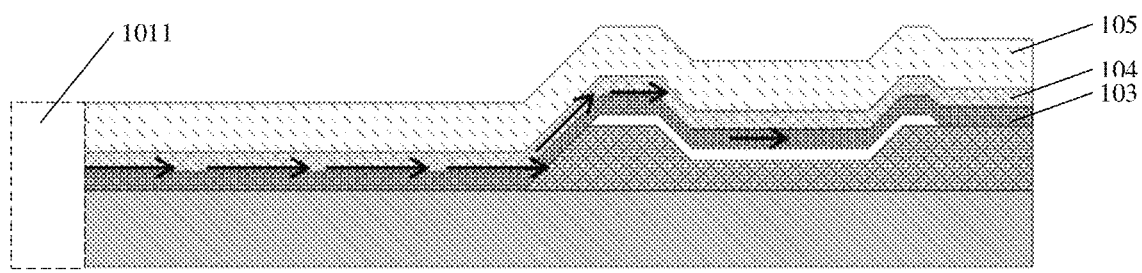
FIG. 1B is a cross-sectional schematic diagram taken along a line A-A illustrated in FIG. 1A.

For example, FIG. 1A illustrates a planar schematic diagram of a display substrate of a display device, and FIG. 1B is a cross-sectional schematic diagram of the display substrate in FIG. 1A taken along a line A-A. As illustrated in FIG. 1A, the display substrate 100 includes a display region 101, the display region 101 includes a pixel array and has an opening 1011 in the pixel array, the opening 1011 is a position reserved for a camera component (not illustrated), and the camera component for example is disposed on a back side of the display substrate 100 opposite to a display side and overlaps the opening 1011, so that the camera component acquires an image through the opening 1011. Thus, the camera component is combined with the display region 101 of the display substrate 100.

The display region 101 has light emitting elements for display, for example, the light emitting elements are organic light emitting diodes, and an organic function layer 103 (e.g., an electron transport layer, a light emitting layer, a hole transport layer, etc.) and an electrode layer 104 of a plurality of light emitting elements in an entirety or a part of the display region 101 for example are respectively formed on the entire surface of the display region 101. If an encapsulation layer 105 is used for encapsulation, it is often difficult to encapsulate a region having the opening 1011, or it is difficult to ensure an encapsulation effect of this region even the opening 1011 is encapsulated. In this case, as illustrated in FIG. 1B, impurities such as water, oxygen and so on enters the display region 101 from the opening 1011 along the organic function layer 103 and the electrode layer 104 that are formed on the entire surface of the display region 101, and contaminate function materials in the display region 101, thereby causing performances of the function materials to deteriorate, and further affecting the display effect of the display region 101.

For example, a barrier wall is provided around the opening 1011 to break the organic function layer 103 and the electrode layer 104 that are formed on the entire surface of the display region, thereby preventing impurities such as water and oxygen from entering the display region 101 from the opening 1011. However, the formation of the barrier wall sometimes affects the structure of the display substrate and the display effect.

At least one embodiment of the present disclosure provides a preparation method of a display substrate, the above-mentioned barrier wall is formed by the preparation method, and the formation of the barrier wall does not adversely affect other structure of the display substrate, so as to ensure the structural integrity of the display substrate and further improve the reliability of the display substrate.

The preparation method of the display substrate comprises: forming a display region and a non-display region, in which the display region at least partially surrounds the non-display region, and the non-display comprises an opening region; forming a first barrier wall between the display region and the opening region, in which the first barrier wall surrounds the opening region and comprises a first metal layer structure, and a recess is formed on at least one side surface, surrounding the opening region, of the first metal layer structure; and after the first barrier wall is formed, forming a conductive layer pattern in the display region and on the first barrier wall. The forming the conductive layer pattern comprises: forming a conductive material layer in the display region and on the first barrier wall, in which the conductive material layer is disconnected at the first barrier wall; and patterning the conductive material layer to form the conductive layer pattern.

At least one embodiment of the present disclosure provides a display substrate, and the display substrate comprises a display region and a non-display region, the display region at least partially surrounds the non-display region, the non-display comprises an opening region; the display substrate further comprises a first barrier wall between the display region and the opening region, the first barrier wall surrounds the opening region and comprises a first metal layer structure, and a recess is on at least one side surface, surrounding the opening region, of the first metal layer structure; the display region comprises a conductive layer pattern, the conductive layer pattern is further provided on the first barrier wall, and the conductive layer pattern is disconnected on the at least one side surface of the first barrier wall.

At least one embodiment of the present disclosure provides a display device comprising the display substrate formed by the above-mentioned preparation method, or comprising the above-mentioned display substrate.

The display substrate, the preparation method thereof and the display device provided by some embodiments of the present disclosure are described by several specific embodiments in the following.

Figure 2A:
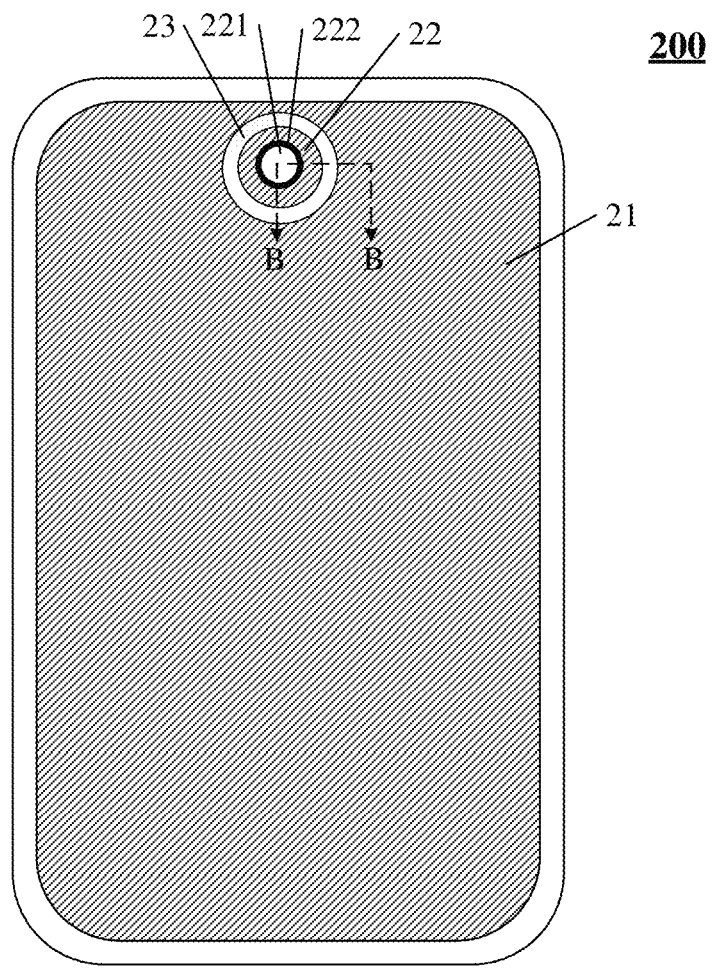
FIG. 2A is a planar schematic diagram of a display substrate provided by at least one embodiment of the present disclosure.

At least one embodiment of the present disclosure provides the display substrate. FIG. 2A illustrates a planar schematic diagram of the display substrate, and FIG. 2B is a cross-sectional schematic diagram of the display substrate in FIG. 2A taken along a line B-B.

The display substrate 200 includes a display region 21 and a non-display region 22, the display region 21 at least partially surrounds the non-display region 22, and the non-display region 22 includes an opening region 222. The display substrate 200 further includes a first barrier wall 23 between the display region 21 and the opening region 222, and the first barrier wall 23 is disposed in the non-display region 22 between the display region 21 and the opening region 222. The first barrier wall 23 surrounds the opening region 222, and the first barrier wall 23 includes a first metal layer structure, a recess 231 is formed on at least one side surface, surrounding the opening region 222, of the first metal layer structure. The display region 21 includes a conductive layer pattern 218, the conductive layer pattern 218 is further provided on the first barrier wall 23. For example, a portion of a material 2180 of the conductive layer pattern 218 extends to the first barrier wall 23 to cover the first barrier wall 23 and is disconnected at the at least one side surface of the first barrier wall 23. For example, the portion of the material 2180 which covers the first barrier wall 23 and is disconnected at the at least one side surface of the first barrier wall 23 and the portion of the material 2180 in the display region 22 are formed simultaneously using a same conductive material layer during forming the conductive layer pattern 218 by a patterning process.

Figure 2B:
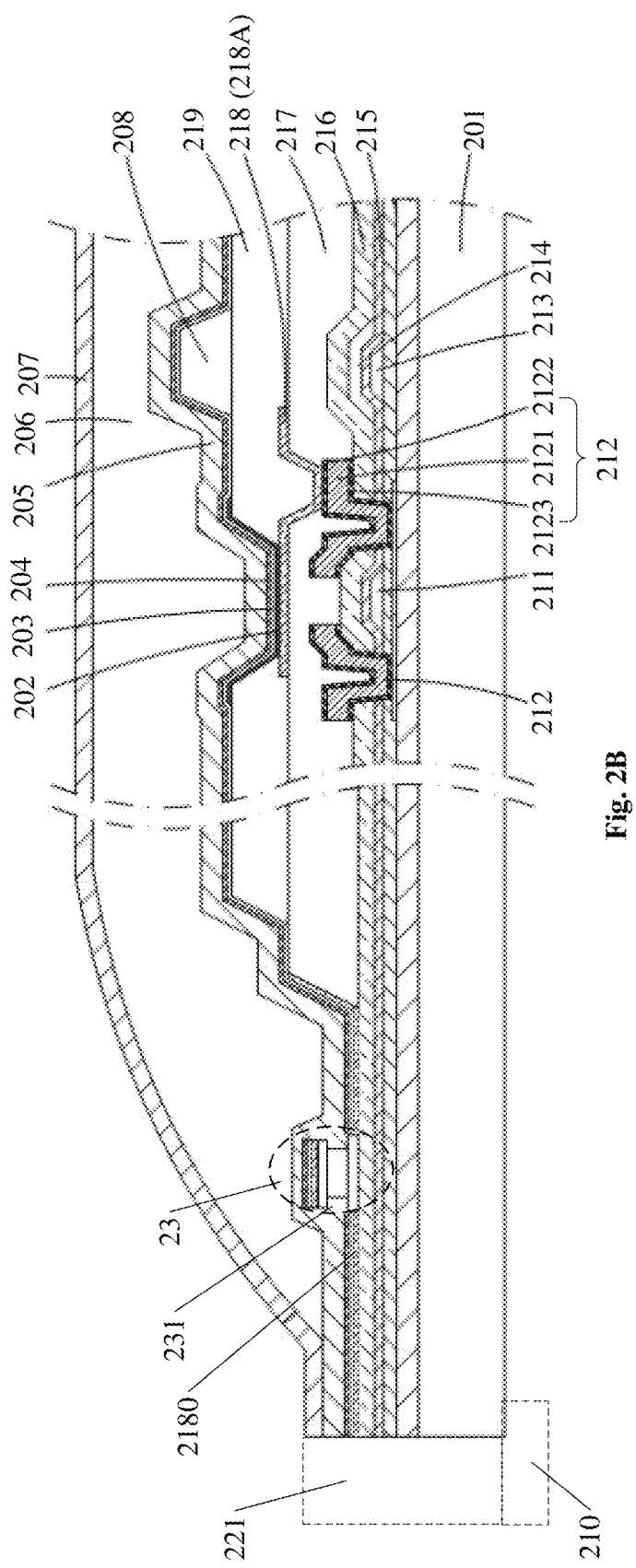
FIG. 2B is a cross-sectional schematic diagram taken along a line B-B illustrated in FIG. 2A.

For example, in the first metal layer structure illustrated in FIG. 2B, both a side surface, facing the opening region 222, of the first metal layer structure and a side surface, away from the opening region 222, of the first metal layer structure, include the recess 231, thus the material 2180 of the conductive layer pattern 218 is disconnected at each of the above-described two side surfaces of the first barrier wall 23. For example, in other embodiments, the first barrier wall 23 has the recess 231 only on one side surface of the first metal layer structure, as long as the first barrier wall 23 realizes the technical effect of enabling that the function layer formed on the first barrier wall 23 is broken.

For example, as illustrated in FIG. 2B, the display substrate 200 further includes a base substrate 201. For example, an opening direction of the recess 231 of the first metal layer structure of the first barrier wall 23 is parallel to a plane (i.e., a plate surface of the base substrate 201) in which the base substrate 201 is located. For example, in the embodiments of FIG. 2B, the base substrate 201 is placed along a horizontal direction, and the opening direction of the recess 231 is the horizontal direction. For example, the depth of the recess 231, that is, the distance of the recess 231 penetrating into the side surface of the first metal layer structure in the direction parallel to the base substrate 201 is ranged from 0.6 µm to 1 µm, for example, 0.6 µm, 0.7 µm, 0.8 µm, or the like.

For example, the display substrate 200 further includes an opening 221 located in the opening region 222. The opening 221 is configured to allow light from a display side (i.e. an upper side in FIG. 2B) of the display substrate 200 to be transmitted through the display substrate 200 and then reach a back side (i.e. a lower side in FIG. 2B) of the display substrate 200.

For example, in some embodiments, the display substrate 20 further includes an image sensor 210 and/or an infrared sensor 210 located in the opening region 222. For example, the image sensor 210 and/or the infrared sensor 210 are bonded to the back side of the display substrate 200, and an orthographic projection of the image sensor 210 and/or the infrared sensor 210 on the display substrate 200 at least partially overlaps with the opening 221. For example, the image sensor 210 and/or the infrared sensor 210 realizes functions of image acquisition, face recognition, infrared sensing, etc. through the opening 221. As a result, the display substrate 200 integrates the image sensor 210 and/or the infrared sensor 210 with the display region 21, thereby improving the screen occupation ratio of the display region 21.

For example, the display region 21 includes a pixel array for performing a display function, the pixel array includes a plurality of pixel units arranged in an array, and each of the pixel units includes a driving circuit, a light emitting element, and the like. For example, the light emitting element includes a first electrode 218A, a second electrode 204, and an organic function layer between the first electrode 218A and the second electrode 204. For example, the conductive layer pattern 218 includes the first electrode 218A, that is, the portion of the conductive layer pattern 218 provided in the display region severs as the first electrode 218A. The organic function layer includes, for example, a light emitting material layer 202 and an auxiliary light emitting layer 203; and the auxiliary light emitting layer 203 is, for example, a function layer that improves the light emitting efficiency or the light emitting effect of the light emitting material layer 202, such as an electron transport layer, an electron injection layer, a hole transport layer, a hole injection layer, etc. The second electrode 204 of the light emitting element and at least a portion (such as, the auxiliary light emitting layer 203) of the organic function layer of the light emitting element in the plurality of pixel units for example are formed on the entire surface of the display region, in this case, the organic function layer is disconnected (that is, broken) at the side surface having the recess 231 of the first barrier wall 23.

For example, the first electrode 218A is an anode (for example, a pixel electrode or an electrode electrically connected to the pixel electrode), the second electrode 204 is a cathode, and the cathode is also disconnected at the side surface having the recess 231 of the first barrier wall 23. As a result, even if a portion of the organic function layer and a portion of the second electrode 204 that are on a side close to the opening 221 are contaminated with impurities such as water and oxygen, because the organic function layer and the second electrode 204 are broken by the first barrier wall 23, these contaminated impurities cannot enter a portion of the organic function layer and a portion of the second electrode 204 that are used for light emission of the light emitting element. For example, a portion of the organic function layer and a portion of the second electrode 204 are formed on the top of the first barrier wall 23, but these portions are separated from other portions of the function layer and the second electrode 204, so that a transmission channel for impurities such as water and oxygen cannot be formed.

For example, the driving circuit included in each pixel unit includes a thin film transistor, a capacitor, and the like. For example, the thin film transistor includes a second metal pattern, the second metal pattern includes a second metal layer structure, and the first metal layer structure has a same structure as and is made of a same material as the second metal layer structure. For example, the first metal layer structure and the second metal layer structure are formed simultaneously in the preparation process of the display substrate and have a same multilayer structure. For example, layers in the multilayer structure of the first metal layer structure and layers, corresponding to the layers in the multilayer structure of the first metal layer structure, of the multilayer structure of the second metal structure, are formed of same materials, thereby the first metal layer structure and the second metal layer structure are formed simultaneously by same layers.

For example, as illustrated in FIG. 2B, the thin film transistor includes a gate electrode 211, a source and drain electrode 212, and the like, the capacitor includes a first electrode 213, a second electrode 214, and a first insulation layer 215 between the first electrode 213 and the second electrode 214. For example, the gate electrode 211 or the source and drain electrode 212 is implemented as the second metal pattern comprising the second metal layer structure.

For example, it is illustrated in FIG. 2B that the source and drain electrode 212 includes the second metal layer structure. In this case, the first metal layer structure of the first barrier wall 23 and the second metal layer structure of the source and drain electrode electrodes 212 has the same structure and comprise the same material. For example, the first metal layer structure of the first barrier wall 23 and the second metal layer structure of the source and drain electrode 212 are formed simultaneously and have the same multilayer structure, so that the first metal layer structure of the first barrier wall 23 and the second metal layer structure of the source and drain electrodes 212 are formed by using same layers in the preparation process of the display substrate 200. For example, in some examples, each of the first metal layer structure and the second metal layer structure has a multilayer structure such as a double-layer structure or a three-layer structure.

Figure 3A:
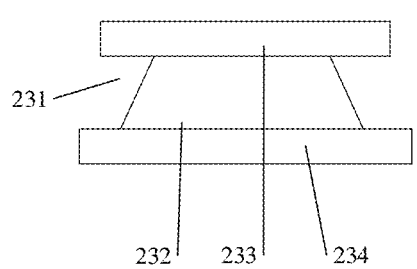
FIG. 3A is a cross-sectional schematic diagram of a first barrier wall in the display substrate provided by at least one embodiment of the present disclosure.

For example, in one example, as illustrated in FIG. 3A, the first metal layer structure of the first barrier wall 23 includes three metal layers, i.e., a first sub-metal pattern 232, a second sub-metal pattern 233, and a third sub-metal pattern 234 that are stacked on the base substrate 201. An orthographic projection of the first sub-metal pattern 232 on the base substrate 201 is within an orthographic projection of the second sub-metal pattern 233 on the base substrate 201, and the orthographic projection of the first sub-metal pattern 232 on the base substrate 201 is also within an orthographic projection of the third sub-metal pattern 234 on the base substrate 201, thereby forming the recess 231 on the side surface of the first metal layer structure constituted by the stacked three layers.

Figure 3B:
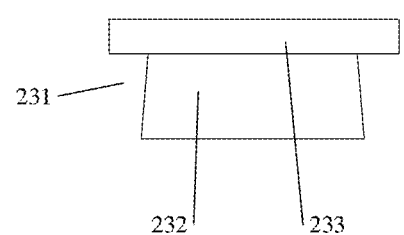
FIG. 3B is another cross-sectional schematic diagram of the first barrier wall in the display substrate provided by at least one embodiment of the present disclosure.

For example, in one example, as illustrated in FIG. 3B, the first metal layer structure of the first barrier wall 23 includes a double metal layers, i.e., the first sub-metal pattern 232 and the second sub-metal pattern 233 that are sequentially stacked formed on the base substrate 201. The orthographic projection of the first sub-metal pattern 232 on the base substrate 201 is within the orthographic projection of the second sub-metal pattern 233 on the base substrate 201, thereby forming the recess 231 on the side surface of the first metal layer structure constituted by the stacked two layers.

In the above case, during forming the organic function layer and the second electrode 204 on the base substrate 201 on which the first barrier wall 23 has been formed, both the organic function layer and the second electrode 204 are disconnected (i.e., broken) at the recess 231 of the first barrier wall 23, thereby breaking the path of impurities such as water, oxygen and the like entering into the display region 21.

For example, the display substrate illustrated in FIG. 2B has the first barrier wall 23 with the above-mentioned first metal layer structure of three layers, in this case, the second metal layer structure included in the source and drain electrode 212 includes a metal sub-layer 2123 which is in the same layer as the third sub-metal pattern 234, a metal sub-layer 2121 which is in the same layer as the first sub-metal pattern 232, and a metal sub-layer 2122 which is in the same layer as the second sub-metal pattern 233.

For example, in the first metal layer structure of the first barrier wall 23, the thickness of the first sub-metal pattern 232 is larger than each of the thickness of the second sub-metal pattern 233 and the thickness of the third sub-metal pattern 234, thereby facilitating the formation of the recess 231, and the disconnection of the organic function layer and the disconnection of the second electrode 204 at the first barrier wall 23, and thereby the first barrier wall 23 realizes a better barrier effect.

For example, in some embodiments of the present disclosure, a material of the first sub-metal pattern 232 and a material of the second sub-metal pattern 233 have different etching rates during etching. In the case where the first metal layer structure has the third sub-metal pattern 234, for example, a material of the third sub-metal pattern 234 and the material of the second sub-metal pattern 233 are the same. For example, under the action of etching liquid for forming the first metal layer structure, the material of the first sub-metal pattern 232 is etched faster than the material of the second sub-metal pattern 233, so that it is easy to form the first metal layer structure with the recess 231 in the preparation process.

For example, in some embodiments, the material of the first sub-metal pattern 232 includes a metal such as aluminum or copper, or includes an alloy thereof, the material of the second sub-metal pattern 233 includes a metal such as titanium or molybdenum or an alloy thereof, and the material of the third sub-metal pattern 234 is the same as the material of the second sub-metal pattern 233 and includes a metal such as titanium or molybdenum or an alloy thereof.

For example, in some examples, in the case that the first metal layer structure adopts the double-layer structure, a combination of the materials of the first sub-metal pattern 232 and the second sub-metal pattern 233 is aluminum/titanium, or aluminum/molybdenum, or copper/titanium or copper/molybdenum, etc. In the case that the first metal layer structure adopts the three-layer structure, a combination of the materials of the third sub-metal pattern 234, the first sub-metal pattern 232 and the second sub-metal pattern 233 is titanium/aluminum/titanium, or molybdenum/aluminum/molybdenum, or titanium/copper/titanium or molybdenum/copper/molybdenum, etc.

It should be noted that in some examples of the embodiment described above, the display substrate 200 further includes structures such as a second insulation layer 216 covering the capacitor, a flat layer 217 that planarizes the driving circuit, a pixel definition layer 219 that defines the pixel array, a columnar spacer 208 that defines an encapsulation space, an encapsulation layer 205 for sealing, a second encapsulation layer 206 and a third encapsulation layer 207 that further improve the encapsulation effect, and the like, which are not be described in detail in the embodiments of the disclosure. In the examples of the embodiment described above, because the source and drain electrode 212 of the thin film transistor is connected to the first electrode 218A, the thin film transistor is a driving transistor, i.e., the magnitude of the current flowing through the light emitting element is controlled according to the data signal applied to the driving circuit, thereby controlling the gray scale of the pixel unit in the display process.

In some embodiments of the present disclosure, for example, more than one barrier walls are disposed around the opening region 2011 of the display panel, that is, multiple barrier walls are included in the display substrate, for example, two barrier walls, three barrier walls, four barrier walls, or five barrier walls, etc. are disposed in parallel to each other to enhance the barrier effect.

Figure 4A:
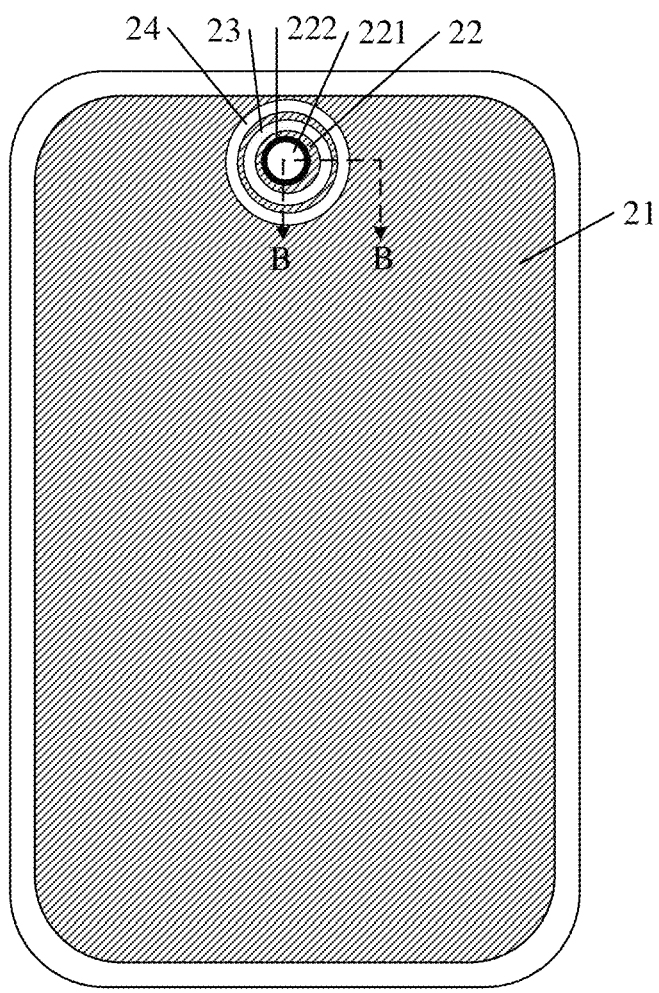
FIG. 4A is another planar schematic diagram of the display substrate.
Figure 4B:
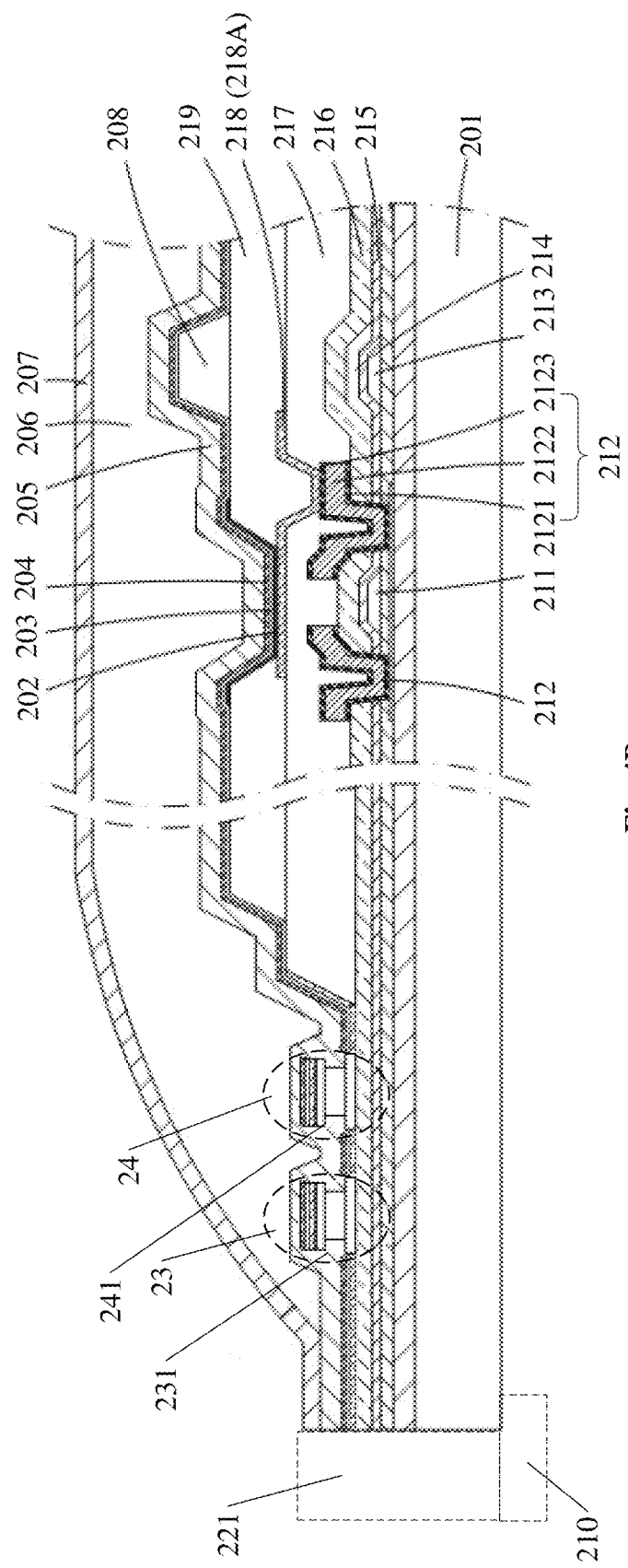
FIG. 4B is a cross-sectional schematic diagram taken along a line B-B illustrated in FIG. 4.

For example, the display substrate 200 illustrated in FIG. 4A and FIG. 4B includes two barrier walls, the display substrate illustrated in FIG. 4A and FIG. 4B differs from the display substrate illustrated in FIG. 3A and FIG. 3B in that the display substrate illustrated in FIG. 4A and FIG. 4B includes a second barrier wall 24 in addition to the first barrier wall 23. The second barrier wall 24 surrounds the opening region 222, and the second barrier wall 24 is disposed at a side, away from the opening region 222, of the first barrier wall 23 and is spaced apart from the first barrier wall 23 by a distance. The second barrier wall 24 also includes the first metal layer structure, and at least one side surface, surrounding the opening region 222, of the first metal layer structure of the second barrier wall 24 has a recess 241. For example, the first barrier wall 23 and the second barrier wall 24 are formed simultaneously using same layers in the preparation process. Other structures of the display substrate 200 illustrated in FIG. 4A and FIG. 4B may refer to the above-mentioned embodiments and are not be described here again.

At least one embodiment of the present disclosure further provides a preparation method of a display substrate, and the preparation method comprises: forming a display region and a non-display region, in which the display region at least partially surrounds the non-display region, the non-display region comprises an opening region, a first barrier wall is formed between the display region and the opening region, the first barrier wall surrounds the opening region and comprises a first metal layer structure, and at least one side surface, surrounding the opening region, of the first metal layer structure is formed with a recess; and after the first barrier wall is formed, forming a conductive layer pattern in the display region and on the first barrier wall. For example, the forming the conductive layer pattern includes: forming a conductive material layer in the display region and on the first barrier wall, in which the conductive material layer is disconnected at the first barrier wall; and patterning the conductive material layer to form the conductive layer pattern.

According to the preparation method, the conductive layer pattern is formed after forming the first barrier wall, but the preparation process for forming the conductive layer pattern, such as an etching process, is designed to do not etch the first barrier wall and thus do not affect other structures of the display substrate, thereby ensuring the structural integrity of the display substrate and further improving the reliability of the display substrate.

Figure 8A:
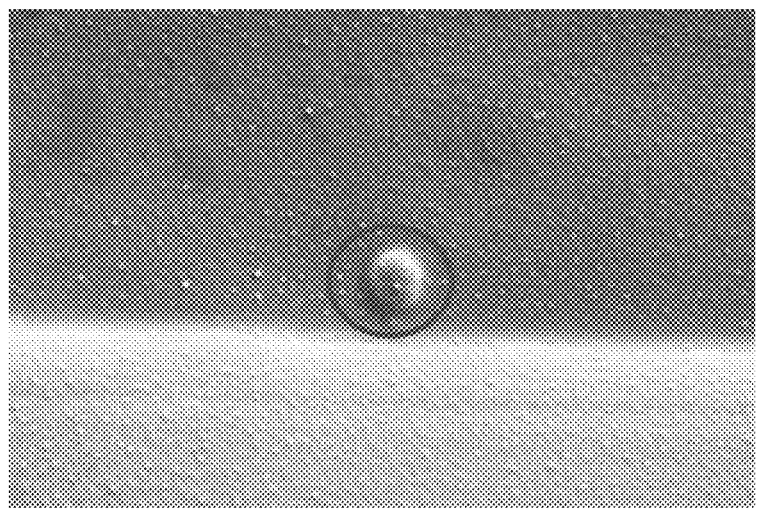
FIG. 8A is a scanning electron microscope view of metal particles formed in a display substrate according to one technique.
Figure 8B:
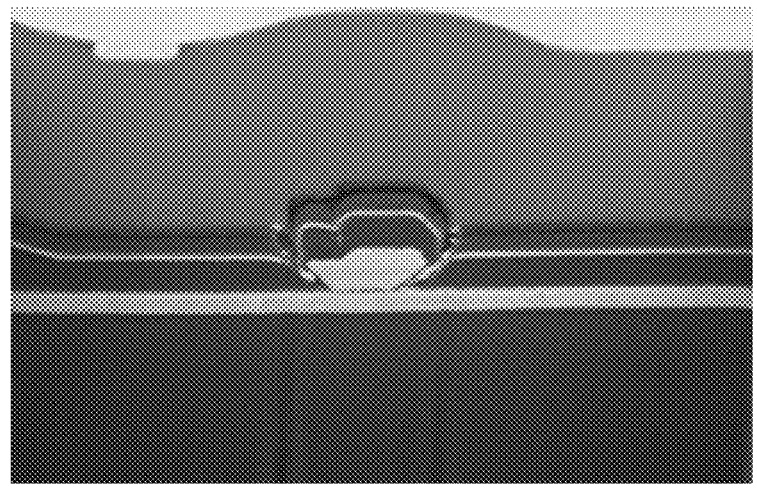
FIG. 8B is a scanning electron microscope view of a function layer on the metal particles in the display substrate illustrated in FIG. 8A.

For example, in some preparation processes, in the case that the etching solution used for forming the conductive layer pattern also etches the first barrier wall, because the etching solution contains some metal ions such as silver ions, the metal ions may be replaced by the metal material (e.g., elemental metal or alloy), such as aluminum, etc., included in the first barrier wall to generate metal silver, and the metal silver exists in a form of particles on the display substrate, for example, exists on the conductive layer pattern, thus affecting the integrity of the function layer formed subsequently. For example, the light emitting material layer is formed after forming the conductive layer pattern, the light emitting material layer is easily broken at the particles of the metal silver, so that the light emitting material layer is discontinuous, thus causing defects, such as dark spots, on the display substrate during display. For example, FIG. 8A shows a scanning electron microscope image of metal particles formed on the display substrate, such as silver particles (the circled part in the figure), and FIG. 8B is a scanning electron microscope image of the function layer formed on the metal particles in the display substrate illustrated in FIG. 8A. It can be seen that in the case that the metal particles are formed on the display substrate because of the above-mentioned reasons, the metal particles seriously affect the integrity of the subsequently formed function layer, resulting in a poor display effect. The preparation process provided by the embodiments of the disclosure can avoid such adverse effect and improve the display quality and reliability of the display substrate.

For example, in some embodiments, the preparation method further includes: forming an opening at a position in the opening region of the display substrate. The opening is used, for example, to be bonded with an image sensor and/or an infrared sensor and/or other devices with the function of image acquisition, face recognition, infrared sensing and the like.

For example, in some embodiments, the preparation method further includes: bonding the image sensor and/or the infrared sensor in the opening region. Therefore, the image sensor and/or the infrared sensor are integrated with the display region, and the screen occupation ratio of the display region is improved.

In the following, the preparation method of the display substrate provided by at least one embodiment of the present disclosure is described in detail taking the formation of the display substrate 200 illustrated in FIG. 2A and FIG. 2B as an example.

Figure 5A:
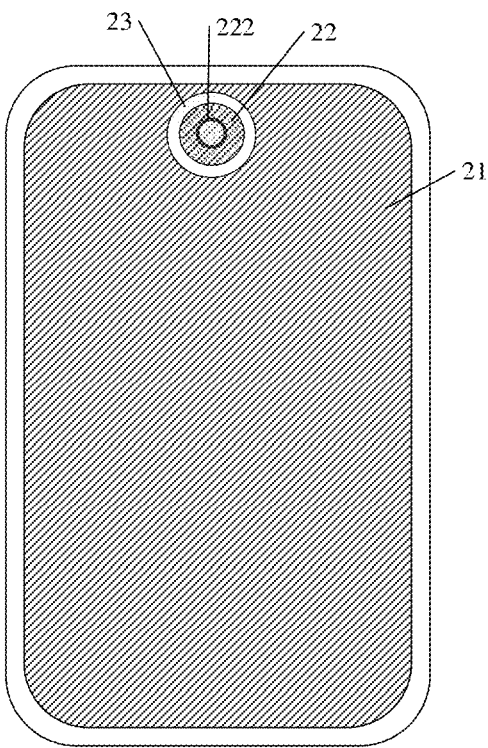
FIG. 5A-FIG. 5B are planar schematic diagrams of the display substrate in a preparation process thereof provided by at least one embodiment of the present disclosure.

As illustrated in FIG. 5A, the display region 21 and the non-display region 22 are formed first, and the non-display region 22 includes the opening region 222.

As illustrated in FIG. 6A to FIG. 6G, the forming the display region 21 includes forming structures such as the light emitting element of the pixel array and the driving circuit for driving the light emitting element. The embodiments of the present disclosure do not limit the specific structure and the manufacturing method of the light emitting element of the pixel array and the specific structure and the manufacturing method of the driving circuit for driving the light emitting element.

Figure 6A:
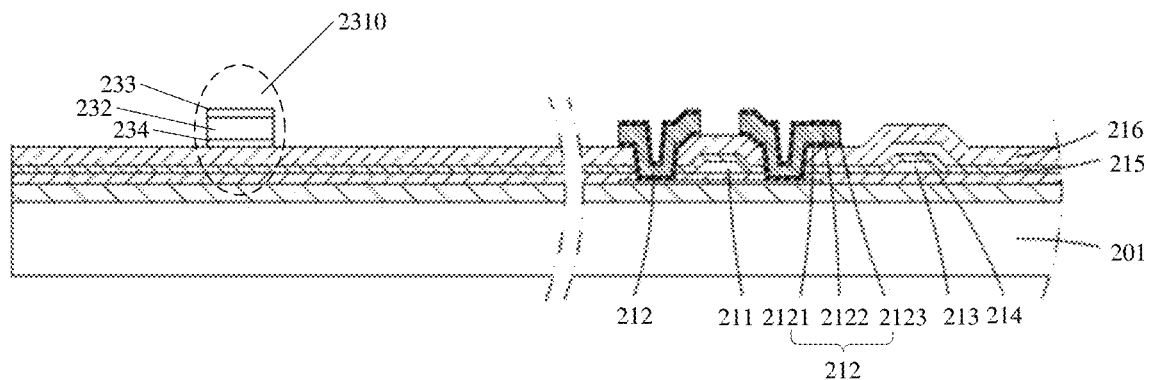
FIG. 6A-FIG. 6G are cross-sectional schematic diagrams of the display substrate in the preparation process thereof provided by at least one embodiment of the present disclosure.

For example, as illustrated in FIG. 6A, a driving circuit layer is first formed on the base substrate 201, which includes forming structures such as the thin film transistor and the storage capacitor in the display region 21. For example, function layers of the structures such as the thin film transistor and the storage capacitor are sequentially formed on the base substrate 201 by patterning processes. For example, one patterning process includes photoresist formation, exposure, development, etching and other processes.

For example, in some embodiments, the forming the display region 21 includes forming the second metal pattern, for example, the forming the thin film transistor in the display region 21 includes forming the second metal pattern; the second metal pattern includes the second metal layer structure, and the first metal layer structure and the second metal layer structure are formed using same layers, thereby simplifying the preparation process. For example, the first metal layer structure and the second metal layer structure is a double-layer structure or a three-layer structure, etc. The specific structure and materials thereof may refer to the above-mentioned embodiments and are not be described here.

For example, in some embodiments, the forming the first metal layer structure includes: forming a first metal material pattern on the base substrate and etching the first metal material pattern with a first etching solution to form the recess.

For example, in the case where the first metal layer structure includes the double-layer structure, the forming the first metal material pattern includes: forming the first sub-metal pattern and the second sub-metal pattern that are sequentially stacked on the base substrate, and in this case, the etching rate of the first etching liquid to the first sub-metal pattern is larger than the etching rate of the first etching liquid to the second sub-metal pattern.

For example, in the case where the first metal layer structure includes the three-layer structure, the forming the first metal material pattern includes: forming the third sub-metal pattern, the first sub-metal pattern, and the second sub-metal pattern that are sequentially stacked on the base substrate, in this case, the etching rate of the first etching liquid to the first sub-metal pattern is larger than both the etching rate of the first etching liquid to the second sub-metal pattern and the etching rate of the first etching liquid to the third sub-metal pattern.

For example, as illustrated in FIG. 6A, the gate electrode 211 of the thin film transistor and the first electrode 213 of the storage capacitor are formed by the same layer and the same patterning process to simplify the preparation process. For example, the gate electrode 211 and the first electrode 213 of the storage capacitor include a metal such as aluminum, titanium, cobalt, etc. or an alloy thereof. In the preparation process of the gate electrode 211 of the thin film transistor and the first electrode 213 of the storage capacitor, a gate electrode material layer is first formed by a method of sputtering or evaporation, and then a patterning process is performed on the gate electrode material layer to form the gate electrode 211 and the first electrode 213 of the storage capacitor.

For example, the source and drain electrode 212 of the thin film transistor is formed to have the multi-layer structure, for example, the three-layer structure illustrated in the figure, in this case, the source and drain electrode 212 is implemented as the above-mentioned second metal pattern.

For example, three metal material layers are sequentially formed by a method of sputtering or vapor deposition; for example, the three metal material layers are respectively a titanium material layer, an aluminum material layer, and a titanium material layer; and then the three metal material layers are patterned by the same patterning process to form the three-layer electrode structure of titanium 2121/aluminum 2122/titanium 2123 to constitute the source and drain electrode 212; during forming the source and drain electrode 212, the first metal material pattern 2310 is formed, i.e., an initial first barrier wall for forming the first barrier wall is formed, and the first metal material pattern 2310 surrounds the opening region. In the example illustrated in FIG. 6A, the first metal material pattern 2310 includes the third sub-metal pattern 234, the first sub-metal pattern 232, and the second sub-metal pattern 233 that are sequentially stacked on the base substrate 201. For example, the etching method used in the above patterning process is dry etching, so that each of the side surface of the source and drain electrode 212 and the side surface of the first metal material pattern 2310 is a flush structure.

Figure 6B:
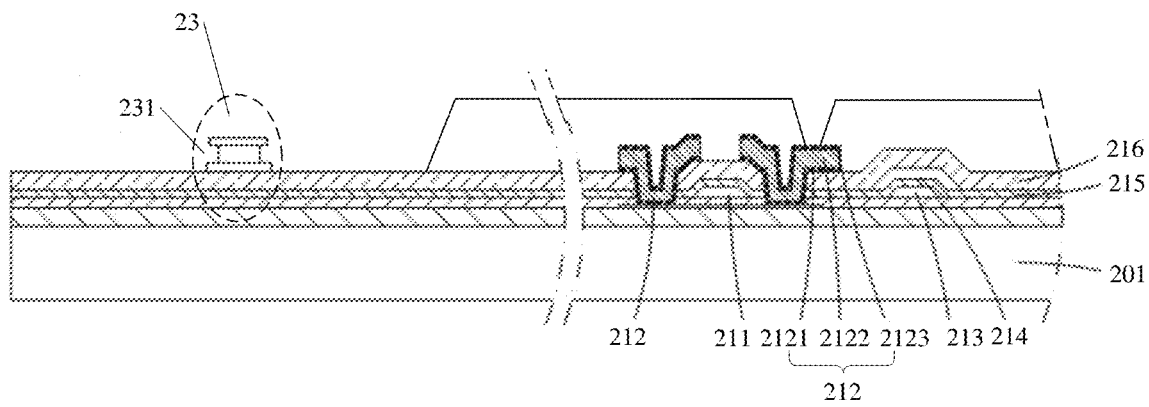

As illustrated in FIG. 6B, after the above processes, the flat layer 217 is formed for example in the display region. For example, the flat layer 217 is formed by a patterning process using an organic material such as a resin material or an inorganic material such as silicon nitride or silicon oxide. For example, the flat layer 217 covers the source and drain electrode 212, and the flat layer 217 includes a via hole exposing a portion of the source and drain electrode 212 so that the first electrode 218A formed later is connected to the source and drain electrode 212 through the via hole.

For example, after the flat layer 217 is formed, the first metal material pattern 2310 is etched with the first etching solution to form the recess 231. For example, in the case where the first metal layer structure has the three-layer structure, the etching rate of the first etching liquid to the first sub-metal pattern 232 is larger than each of the etching rate of the first etching liquid to the second sub-metal pattern 233 and the etching rate of the first etching liquid to the third sub-metal pattern 231, thereby the recess 231 is formed. Moreover, because the source and drain electrode 212 is covered by the flat layer 217, the source and drain electrode 212 is not further etched.

Figure 6C:
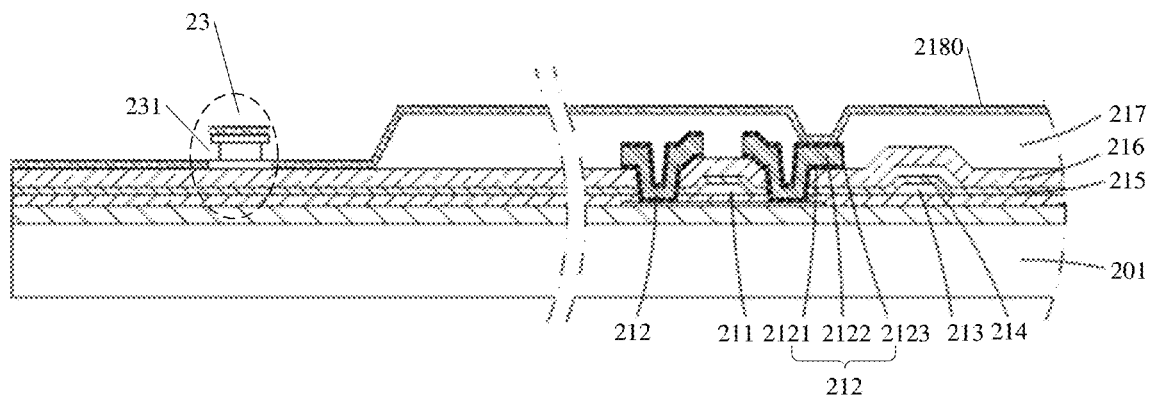
Figure 6D:
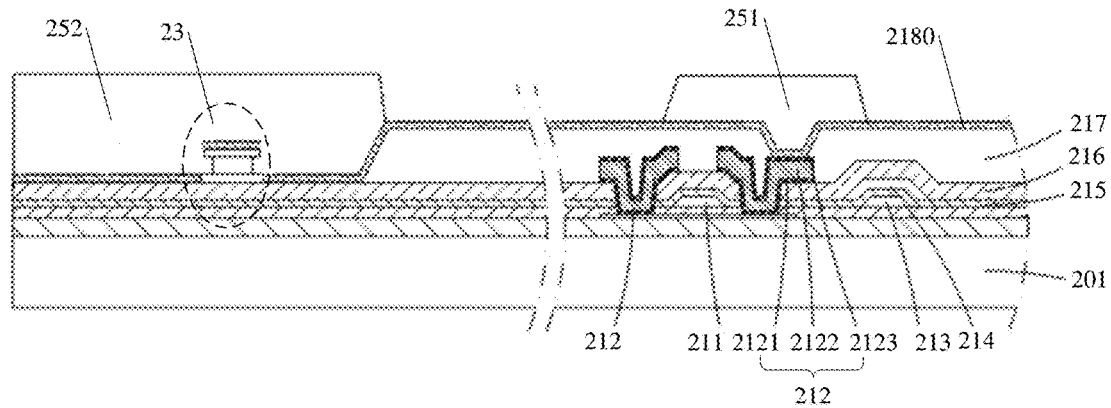
Figure 6E:
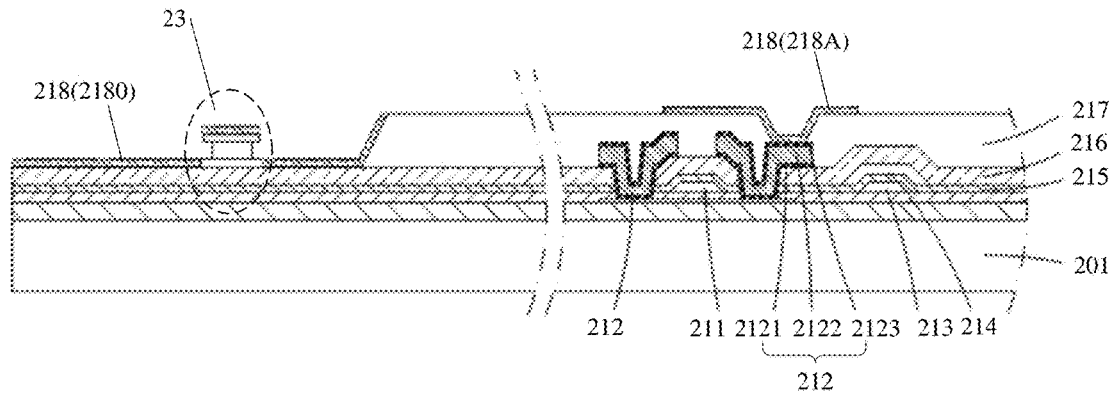

As illustrated in FIG. 6C-FIG. 6E, after the first barrier wall 23 is formed, the light emitting element is formed, and the light emitting element includes the first electrode, the second electrode, and the organic function layer between the first electrode and the second electrode. For example, the organic function layer includes the light emitting material layer and the auxiliary light emitting layer.

For example, the first electrode 218A is formed first, and the first electrode 218A is implemented as a portion of the conductive layer pattern described above. As illustrated in FIG. 6C, the forming the first electrode 218A includes: forming a conductive material layer 2180 in the display region 21 and on the first barrier wall 23, in which the conductive material layer 2180 is disconnected at the first barrier wall 23, and then patterning the conductive material layer 2180 to form the conductive layer pattern including the first electrode 218A.

As illustrated in FIG. 6D and FIG. 6E, the patterning the conductive material layer 2180 includes: forming a photoresist pattern on the conductive material layer 2180, for example, the photoresist pattern includes a first portion 251 and a second portion 252, the first portion 251 is used for forming the first electrode 218A in the display region 21, and the second portion 252 covers at least one side surface of the first barrier wall 23 to protect the first barrier wall 23 from being etched. Then, the conductive material layer 2180 is etched with the photoresist pattern as a mask to form the conductive layer pattern 218, the conductive layer pattern 218 includes the first electrode 218A, and the conductive layer pattern 218 further includes a portion of the conductive material 2180 layer that covers the first barrier wall 23 and is broken by the first barrier wall 23.

For example, the first electrode 218A is the anode, and in this case, the material of the conductive material layer 2180 includes a metal oxide such as ITO and IZO, or a metal such as Ag, Al, Mo, or an alloy thereof. For example, the first electrode 218A is connected to the source and drain electrode 212 through the via hole in the flat layer 217.

In the above etching process for forming the first electrode 218A, the etching solution used for forming the first electrode 218A does not etch the first metal layer pattern, thereby preventing the etching solution from reacting with the metal material included in the first metal layer pattern to generate metal particles, thereby further preventing the metal particles from affecting the integrity of other function layers formed subsequentially, and improving the reliability of the display substrate.

Figure 6F:
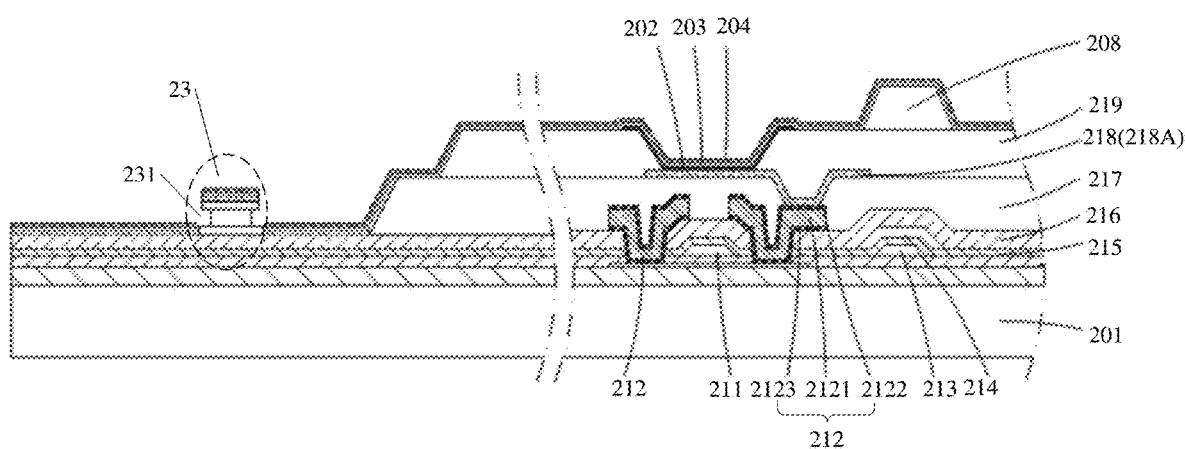
Figure 6G:
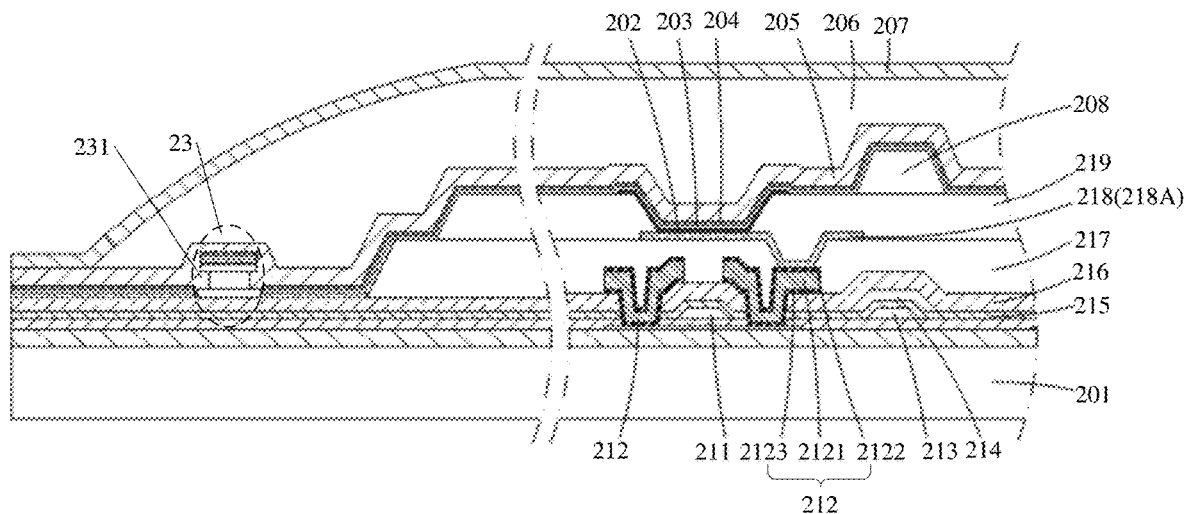

As illustrated in FIG. 6F, after the conductive layer pattern 218 is formed, the pixel definition layer 219 is formed, and the organic function layer is formed in the opening of the pixel definition layer 219, and the organic function layer includes the light emitting material layer 202, the auxiliary light emitting layer 203, and the like.

For example, the pixel definition layer 219 exposing the first electrode 218A is formed on the first electrode 218A by a patterning process. For example, a material of the pixel definition layer 219 includes an organic material such as a resin material or an inorganic material such as silicon nitride, silicon oxide, etc., and the formed pixel definition layer 219 has an opening to facilitate the formation of the organic function layer and the second electrode 204 of the light emitting element later.

For example, the light emitting material layer 202 is formed in the opening of the pixel definition layer 219 by a method of ink jet printing, evaporation, or the like. Then, as illustrated in FIG. 6F, the columnar spacer 208, the auxiliary light emitting layer 203, and the second electrode 204 are formed on the pixel definition layer 219 on which the light emitting material layer 202 is formed.

For example, the columnar spacer 208 is formed by a patterning process using an organic material such as a resin material or an inorganic material such as silicon nitride or silicon oxide, and the columnar spacer 208 is used to form an encapsulation space to facilitate the formation of the encapsulation layer.

For example, the auxiliary light emitting layer 203 and the second electrode layer 204 are formed on the entire surface of the display substrate by a method of evaporation, deposition, ink jet printing, etc. The light emitting material layer 202 includes light emitting materials that respectively emit red light, green light, or blue light, and the auxiliary light emitting layer 203 is, for example, the electron injection layer or the electron transport layer. For example, the second electrode 204 is the cathode, and for example, a material of the second electrode 204 includes a metal such as Mg, Ca, Li or Al or an alloy thereof, or a metal oxide such as IZO and ZTO, or an organic material with a conductive property such as PEDOT/PSS (poly 3,4-ethylenedioxythiophene/polystyrene sulfonate). In this case, the organic function layer and the second electrode 204 that are formed on the entire surface of the display substrate are disconnected on the side surface, with the recess 231, of the first barrier wall 23. Further, two sides of the first barrier wall 23 have the recesses in the figure, so the organic function layer and the second electrode 204 are completely disconnected on both the two sides of the first barrier wall 23.

Therefore, even if a portion of the organic function layer and a portion of the second electrode 204 that are on a side close to the opening region are contaminated, impurities such as water, oxygen and the like cannot diffuse and enter the portion of the organic function layer and the portion of the second electrode 204 that are used for light emission because of the barrier effect of the first barrier wall 23.

For example, after the light emitting element is prepared, the encapsulation layer 205 is formed on the second electrode 204 by a method of chemical vapor deposition, physical vapor deposition, coating, etc. The encapsulation layer 205 provides encapsulation and protection for the function structures located in the display region. For example, the second encapsulation layer 206 and the third encapsulation layer 207 are further formed on the encapsulation layer 205. The second package layer 206 planarizes the encapsulation layer 205, and the third encapsulation layer 207 forms an outer encapsulation. For example, the encapsulation layer 205 and the third encapsulation layer 207 adopt inorganic materials, such as silicon nitride, silicon oxide, silicon oxynitride, and the like, and the second encapsulation layer 206 adopts organic materials, such as polyimide (PI), epoxy resin, and the like. As a result, the encapsulation layer 205, the second encapsulation layer 206 and the third encapsulation layer 207 constitute a composite encapsulation layer, and the composite encapsulation layer provides multiple protection for the function structures of the display region and provides a better encapsulation effect.

In some embodiments of the present disclosure, other necessary function layers may be formed in the display region 201 as required, and these layers may be formed by conventional methods which are not be described here.

Figure 5B:
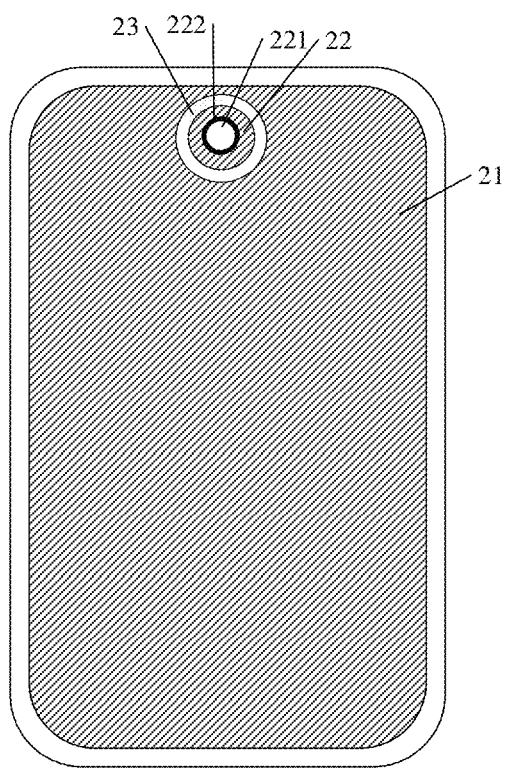

For example, after the display region is formed, as illustrated in FIG. 5B, the opening 221 is formed in the opening region 222. For example, the display substrate 200 is perforated by a method of laser cutting or mechanical punching to form the opening 221.

For example, the opening 221 penetrates through the base substrate 201 and the function layers on the base substrate 201, so that the base substrate 201 is formed with the opening. The region of the opening 221 is equipped with a structure such as the image sensor, the infrared sensor and the like which is in signal connection with, for example, a central processing unit and the like. For example, the structure such as the image sensor or the infrared sensor is disposed on the side, away from the light emitting structure, of the base substrate 201 (i.e., the structure such as the image sensor or the infrared sensor is disposed on the non-display side of the display substrate), and various functions such as photographing, face recognition, infrared sensing and the like are realized by the structure such as the image sensor or the infrared sensor through the opening 221.

It should be noted that in the embodiments of the present disclosure, the thin film transistor illustrated is of the top gate type, but the embodiments of the present disclosure are not limited thereto; for example, the thin film transistor may be of the bottom gate type. For example, the driving circuit includes a plurality of thin film transistors, and each of the thin film transistors may be of the top gate type or the bottom gate type, and may be N type or P type, and the embodiments of the present disclosure are not limited thereto.

In some embodiments of the present disclosure, the light emitting element is an organic light emitting diode or a quantum dot light emitting diode; for example, the organic light emitting diode is of a top emission type, or a bottom emission type, or a double-sided emission type; for example, the organic function layer of the organic light emitting diode is a composite layer, and the composite layer includes the organic light emitting material layer and the auxiliary light emitting layer such as an electron injection layer, an electron transport layer, a hole transport layer, a hole injection layer, and the like. The embodiments of the present disclosure do not limit the specific structure and the type of the organic light emitting diode.

For example, the preparation method of some embodiments of the present disclosure form the display substrate as illustrated in FIG. 4A and FIG. 4B. Different from the above example, during forming the display substrate as illustrated in FIG. 4A and FIG. 4B, the second barrier wall is formed between the display region and the opening region of the display substrate, the second barrier wall surrounds the opening region and is formed on the side, away from the opening region, of the first barrier wall. In this case, the second barrier wall for example is formed with the same layers as the first barrier wall, so that the formed multi-layer barrier wall plays a better role of barrier without increasing processes.

Figure 7A:
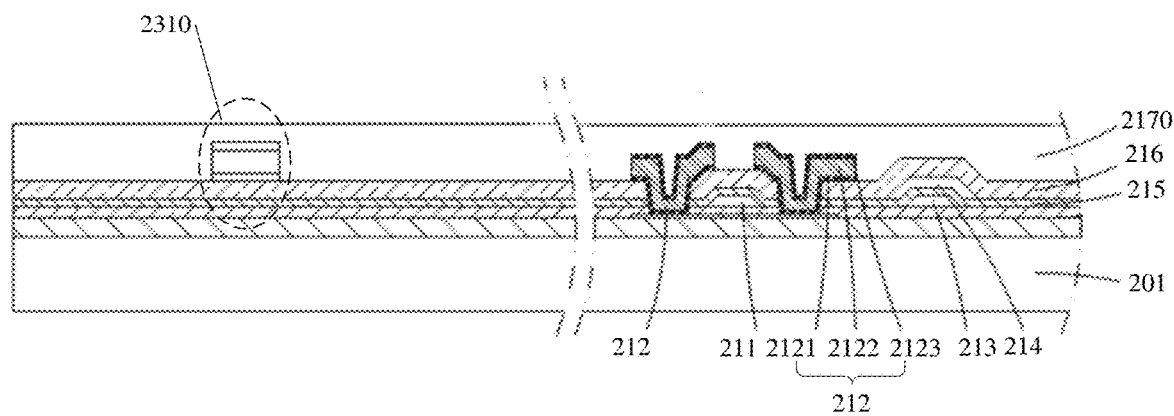
FIG. 7A-FIG. 7B are cross-sectional schematic diagrams of the display substrate in the preparation process thereof provided by at least one embodiment of the present disclosure.
Figure 7B:
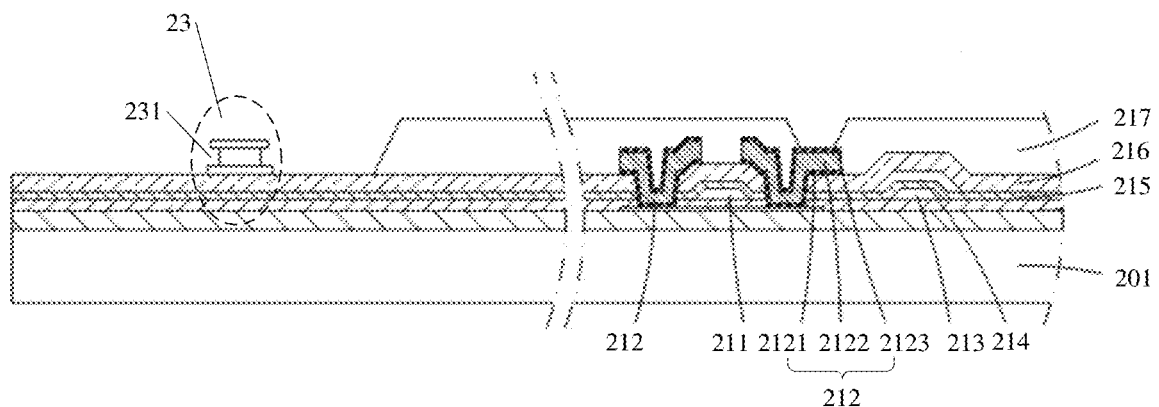

For example, in other embodiments of the present disclosure, the first metal layer structure of the first barrier wall is formed in other ways. For example, forming the first metal layer structure includes: forming the first metal material pattern, in which the formation of the first metal material pattern may refer to the first metal material pattern 2310 formed as illustrated in FIG. 6A in the above embodiment. After the first metal material pattern 2310 is formed, as illustrated in FIG. 7A and FIG. 7B, an insulation material layer 2170 is formed in the display region and on the first metal material pattern 2310, and then the insulation material layer 2170 is patterned with the second etching solution to form the patterned insulation layer 217.

For example, the second etching liquid also etches the first metal material pattern 2310 to form the recess 231. Therefore, the insulation layer 217 and the first barrier wall 23 are formed using the same etching solution, thereby simplifying the preparation process of the display substrate.

For example, the first metal layer structure includes the double-layer structure, and the forming the first metal material pattern includes: forming the first sub-metal pattern and the second sub-metal pattern that are sequentially stacked on the base substrate. Referring to FIG. 3B, in this case, the etching rate of the second etching solution to the first sub-metal pattern 232 is larger than the etching rate of the second etching solution to the second sub-metal pattern 233, thereby facilitating the formation of the recess 231.

For example, the first metal layer structure includes the three-layer structure, and the forming the first metal material pattern includes: forming the third sub-metal pattern, the first sub-metal pattern, and the second sub-metal pattern that are sequentially stacked on the base substrate. Referring to FIG. 3A, in this case, the etching rate of the second etching solution to the first sub-metal pattern 232 is larger than the etching rate of the second etching solution to the second sub-metal pattern 233 and the etching rate of the second etching solution to the third sub-metal pattern 234.

For example, in some examples, the insulation material layer includes a photoresist material, such as polyimide, etc. In this case, the second etching liquid is the development solution of the photoresist material. The development solution is not only used for developing the exposed photoresist material (i.e., the photoresist layer) to obtain the photoresist pattern, but also has an etching effect on the first metal material pattern 2310, for example, has different etching rates to different sub-metal patterns, so as to form the recess 231 of the first metal layer structure. For example, the obtained photoresist pattern may be used for subsequent patterning processes and the like.

For example, the development solution includes a reagent that simultaneously has the above etching effects on the photoresist material of the insulation material layer and the first metal material pattern 2310, and for example, the developing solution includes the reagent such as tetramethyl ammonium hydroxide, tetraethyl ammonium hydroxide, tetrapropyl ammonium hydroxide, alkyl alcohol amine, sodium hydroxide, potassium hydroxide, sodium carbonate, sodium phosphate, sodium dihydrogen phosphate or sodium acetate. For example, each of these reagents has different etching rates to different sub-metal patterns in the first metal material pattern 2310, for example, the etching rate to the first sub-metal pattern 232 is larger than the etching rate to the second sub-metal pattern 233 and the etching rate to the third sub-metal pattern 234, so as to form the recess 231 of the first metal layer structure. For example, in addition to the above-mentioned reagent, the developer solution includes other solvents or additives such as water and surfactants, and the embodiments of the present disclosure have no limitation to this.

For example, in some examples, the development solution includes tetramethyl ammonium hydroxide, a concentration of the tetramethyl ammonium hydroxide in the development solution is ranged from 2% to 8%, and time for the development solution to etch the first metal material pattern 2310 to form the recess 231 is ranged from 60 seconds to 200 seconds. In this case, the depth of the recess, that is, the distance of the recess 231 penetrating into the side surface of the first metal layer structure in the direction parallel to the base substrate 201, for example, is ranged from 0.6 µm to 1 µm. Therefore, the first metal layer structure of the first barrier wall sufficiently realizes the barrier effect.

For example, in some examples, the concentration of methyl ammonium hydroxide is 2.5%, the time for the developer solution to etch the first metal material pattern 2310 to form the recess 231 is 180 seconds; for example, in some examples, the concentration of methyl ammonium hydroxide is 7%, the time for the developer solution to etch the first metal material pattern 2310 to form the recess 231 is 60 seconds; for example, in some examples, the concentration of methyl ammonium hydroxide is 5%, the time for the developer solution to etch the first metal material pattern 2310 to form the recess 231 is 120 seconds; and so on. The concentration of methyl ammonium hydroxide and the time for the developer solution to etch the first metal material pattern 2310 to form the recess 231 may be adjusted according to specific requirements and actual conditions, and the embodiments of the present disclosure have no limitation to this.

For example, after the first metal layer structure of the first barrier wall 23 is formed, other structures of the display substrate are continuously formed with reference to the relevant steps of FIG. 6C-FIG. 6G in the above embodiments, which is not be described here.

In the above method of forming the first metal layer structure of the first barrier wall, the insulation layer 217 and the first barrier wall 23 are formed using the same etching solution, so that the preparation process of the display substrate is simplified; in addition, the above method also forms the conductive layer pattern after forming the first barrier wall, and the preparation process (such as an etching process) for forming the conductive layer pattern is designed to do not etch the first barrier wall, and thus do not affect other structures of the display substrate, thereby ensuring the structural integrity of the display substrate and further improving the display quality and reliability of the display substrate.

At least one embodiment of the disclosure further provides a display device, and the display device comprises the display substrate obtained by the preparation method provided by at least one embodiment of the disclosure or comprises the display substrate provided by at least one embodiment of the disclosure. For example, the display device may be any product or component with a display function such as a mobile phone, a tablet computer, a television, a display, a notebook computer, a digital photo frame, a navigator, and the like, and the embodiments of the present disclosure have no limitation to this.

The following should be noted:

(1) The accompanying drawings involve only the structure(s) in connection with the embodiment(s) of the present disclosure, and other structure(s) may refer to common design(s).

(2) For clarity, in accompanying drawings for illustrating the embodiment(s) of the present disclosure, the thickness of a layer or a structure may be enlarged or reduced. However, it should understood that, in the case in which a component such as a layer, film, region, substrate or the like is referred to be "on" or "under" another component, it may be directly on or under the another component or a component is interposed therebetween.

(3) In case of no conflict, embodiments of the present disclosure and the features in the embodiments may be mutually combined to obtain new embodiments.

What have been described above are only specific implementations of the present disclosure, the protection scope of the present disclosure is not limited thereto. Any modification or substitution that can be easily thought of by those familiar with the art within the technical scope disclosed by the present disclosure should be covered within the protection scope of the present disclosure. Therefore, the protection scope of the present disclosure should be based on the protection scope of the claims.

What is claimed is:

1. A preparation method of a display substrate, comprising:
    forming a display region and a non-display region, wherein the display region at least partially surrounds the non-display region, and the non-display comprises an opening region;
    forming a first barrier wall between the display region and the opening region, wherein the first barrier wall surrounds the opening region and comprises a first metal layer structure, and a recess is formed on at least one side surface, surrounding the opening region, of the first metal layer structure; and
    after the first barrier wall is formed, forming a conductive layer pattern in the display region and on the first barrier wall, wherein the forming the conductive layer pattern comprises: forming a conductive material layer in the display region and on the first barrier wall, in which the conductive material layer is disconnected at the first barrier wall; and patterning the conductive material layer to form the conductive layer pattern.

2. The preparation method of the display substrate according to claim 1, further comprising:
    forming an opening in the opening region of the display substrate; and
    bonding an image sensor and/or an infrared sensor in the opening region, wherein an orthographic projection of the image sensor and/or the infrared sensor on the display substrate at least partially overlaps with the opening.

3. The preparation method of the display substrate according to claim 1, wherein the patterning the conductive material layer comprises:
    forming a photoresist pattern on the conductive material layer, wherein the photoresist pattern covers the at least one side surface of the first barrier wall; and
    etching the conductive material layer with the photoresist pattern as a mask to form the conductive layer pattern.

4. The preparation method of the display substrate according to claim 3, further comprising:
    forming a light emitting element in the display region, wherein the light emitting element comprises a first electrode, a second electrode, and an organic function layer between the first electrode and the second electrode, and the conductive layer pattern comprises the first electrode.

5. The preparation method of the display substrate according to claim 4, wherein
    the organic function layer is disconnected at the first barrier wall;
    the first electrode is an anode, the second electrode is a cathode, and the cathode is disconnected at the first barrier wall.

6. The preparation method of the display substrate according to claim 1, further comprising:
    forming a second metal pattern in the display region, wherein the second metal pattern comprises a second metal layer structure, and the first metal layer structure and the second metal layer structure are formed by same layers.

7. The preparation method of the display substrate according to claim 1, wherein the forming the first metal layer structure comprises:
    forming a first metal material pattern on a base substrate; and
    etching the first metal material pattern with a first etching solution to form the recess.

8. The preparation method of the display substrate according to claim 7, wherein the forming the first metal material pattern comprises:
    forming a first sub-metal pattern and a second sub-metal pattern that are sequentially stacked on the base substrate so that the first sub-metal pattern is between the second sub-metal pattern and the base substrate,
    wherein an etching rate of the first etching liquid to the first sub-metal pattern is larger than an etching rate of the first etching liquid to the second sub-metal pattern.

9. The preparation method of the display substrate according to claim 7, wherein the forming the first metal material pattern comprises:
    forming a third sub-metal pattern, a first sub-metal pattern and a second sub-metal pattern that are sequentially stacked on the base substrate so that the first sub-metal pattern is between the third sub-metal pattern and the second sub-metal pattern,
    wherein an etching rate of the first etching liquid to the first sub-metal pattern is larger than both an etching rate of the first etching liquid to the second sub-metal pattern and an etching rate of the first etching liquid to the third sub-metal pattern.

10. The preparation method of the display substrate according to claim 1, wherein the forming the first metal layer structure comprises:
    forming a first metal material pattern;
    forming an insulation material layer in the display region and on the first metal material pattern; and
    patterning the insulation material layer with a second etching solution to form a patterned insulation layer.

11. The preparation method of the display substrate according to claim 10, wherein the second etching liquid etches the first metal material pattern to form the recess.

12. The preparation method of the display substrate according to claim 11, wherein the insulation material layer comprises a photoresist material, and the second etching liquid is a development solution for the photoresist material.

13. The preparation method of the display substrate according to claim 12, wherein the developing solution comprises tetramethyl ammonium hydroxide, tetraethyl ammonium hydroxide, tetrapropyl ammonium hydroxide, alkyl alcohol amine, sodium hydroxide, potassium hydroxide, sodium carbonate, sodium phosphate, sodium dihydrogen phosphate or sodium acetate.

14. The preparation method of the display substrate according to claim 13, wherein the development solution comprises tetramethyl ammonium hydroxide, a concentration of the tetramethyl ammonium hydroxide in the development solution is ranged from 2% to 8%, and time for the development solution to etch the first metal material pattern to form the recess is ranged from 60 seconds to 200 seconds.

15. The preparation method of the display substrate according to claim 11, wherein the forming the first metal material pattern comprises:
    forming a first sub-metal pattern and a second sub-metal pattern that are sequentially stacked on the base substrate,
    wherein an etching rate of the second etching liquid to the first sub-metal pattern is larger than an etching rate of the second etching liquid to the second sub-metal pattern.

16. The preparation method of the display substrate according to claim 11, wherein the forming the first metal material pattern comprises:

forming a third sub-metal pattern, a first sub-metal pattern and a second sub-metal pattern that are sequentially stacked on the base substrate,
wherein an etching rate of the second etching liquid to the first sub-metal pattern is larger than both an etching rate of the second etching liquid to the second sub-metal pattern and an etching rate of the second etching liquid to the third sub-metal pattern.

17. The preparation method of the display substrate according to claim 8, wherein a material of the first sub-metal pattern comprises aluminum or copper, and a material of the second sub-metal pattern comprises titanium or molybdenum.

18. The preparation method of the display substrate according to claim 9, wherein a material of the first sub-metal pattern comprises aluminum or copper, a material of the second sub-metal pattern comprises titanium or molybdenum, and a material of the third sub-metal pattern comprises titanium or molybdenum.

19. The preparation method of the display substrate according to claim 1, further comprising: forming a second barrier wall between the display region and the opening region,
wherein the second barrier wall surrounds the opening region and is formed on one side, away from the non-display region, of the first barrier wall, and the second barrier wall and the first barrier wall are formed by same layers.

20. A display substrate, comprising:
a display region and a non-display region, wherein the display region at least partially surrounds the non-display region, and the non-display comprises an opening region;
a first barrier wall is provided in the non-display region and is between the display region and the opening region, wherein the first barrier wall surrounds the opening region and comprises a first metal layer structure, and the first metal layer structure comprises a first conductive sub-metal pattern and a second conductive sub-metal pattern that are stacked on a base substrate, the first conductive sub-metal pattern is between the second conductive sub-metal pattern and the base substrate; and an orthographic projection of the first conductive sub-metal pattern on the base substrate is smaller than an orthographic projection of the second conductive sub-metal pattern on the base substrate so that a recess is provided on at least one side surface, surrounding the opening region, of the first metal layer structure, wherein
the display region comprises a conductive layer pattern, the conductive layer pattern is further provided on the first barrier wall and is disconnected on the least one side surface of the first barrier wall by the recess.

* * * * *